United States Patent [19]
Ueda

[11] Patent Number: 5,204,624
[45] Date of Patent: Apr. 20, 1993

[54] METHOD OF MAGNETIC FIELD MEASUREMENT INCLUDING CONVOLUTION STEPS IN AN INTERPOLATION OPERATION TO DETERMINE MAGNETIC FLUX BETWEEN POINTS AT WHICH MAGNETIC FLUX HAS BEEN MEASURED, AND APPARATUS FOR CARRYING OUT THE SAME

[75] Inventor: Tomoaki Ueda, Kyoto, Japan
[73] Assignee: Daikin Industries, Ltd., Japan
[21] Appl. No.: 755,571
[22] Filed: Sep. 5, 1991

[30] Foreign Application Priority Data

Sep. 7, 1990 [JP] Japan ................................ 2-237962

[51] Int. Cl.$^5$ ................. G01R 33/022; G01R 33/035
[52] U.S. Cl. ............................... 324/248; 128/653.1; 505/846
[58] Field of Search .................. 324/248, 242, 244; 128/653.1; 364/577; 505/846

[56] References Cited

U.S. PATENT DOCUMENTS 4,700,135 10/1987 Hoenig ............................... 324/248
4,977,896 12/1990 Robinson et al. .

FOREIGN PATENT DOCUMENTS 325527 7/1989 European Pat. Off. .
359864 3/1990 European Pat. Off. .
WO82/0233 7/1992 PCT Int'l Appl. .

OTHER PUBLICATIONS

Thomas et al, "High Resolution Single Channel Neuromagnetometry and Minimal Approach for Multichannel Systems", *Cryogenics*, vol. 28, No. 11, Guilford GB, pp. 783-795 (Nov. 1988).

Roth et al, "Using a Magnetometer to Image a Two-Dimensional Current Distribution", *Journal of Applied Physics*, vol. 65, No. 1, New York, U.S., pp. 361-372; (Jan. 1989).

Roth et al, "Apodized Pickup Coils for Improved Spatial Resolution of SQUID Magnetometers", *Review of Scientific Instruments*, vol. 61, No. 9, New York, U.S., pp. 2439-2448 (Sep. 1990).

Voorde et al, "High-Resolution magnetic Mapping of PR-interval Phenomena of Normal Subjects", *Medical and Biological Engineering and Computing*, vol. 26, No. 2, Stevenage GB, pp. 130-135 (Mar. 1988).

*Primary Examiner*—Walter E. Snow
*Attorney, Agent, or Firm*—Beveridge, DeGrandi, Weilacher

[57] ABSTRACT

A plurality of magnetic flux measurement data corresponding to two dimensional grids are obtained, then the magnetic flux measurement data are convoluted to sampling unit functions in x-direction and y-direction to obtain an interpolation function. Magnetic field is illustrated by isomagnetic contour lines based on magnetic flux measurement data and interpolation values which are obtained based on the interpolation function. One of the sampling unit functions is replaced with a differential function thereof to obtain partial differential values of arbitrary points.

11 Claims, 11 Drawing Sheets

| A | B |  |  |  |  |  |  |  |  |
|---|---|---|---|---|---|---|---|---|---|
| C |   |  |  |  |  |  |  |  |  |

METHOD OF MAGNETIC FIELD MEASUREMENT INCLUDING CONVOLUTION STEPS IN AN INTERPOLATION OPERATION TO DETERMINE MAGNETIC FLUX BETWEEN POINTS AT WHICH MAGNETIC FLUX HAS BEEN MEASURED, AND APPARATUS FOR CARRYING OUT THE SAME

BACKGROUND OF THE INVENTION

The present invention relates to magnetic field measurement methods, magnetic field measurement apparatus, magnetic field display methods and magnetic field display apparatus. More particularly the present invention relates to methods and apparatus for measuring magnetic flux at a plurality of points which correspond to two dimensional grids using plural flux meters including superconducting quantum interference devices (hereinafter referred to as SQUID flux meters), for interpolating magnetic flux between the measured points based on the measured magnetic flux and for displaying the measured and interpolated magnetic flux when the display is required.

It is known that a SQUID has a characteristic capable of detecting magnetic flux with extremely high sensitivity. With attention to this characteristic, a SQUID is applied to various apparatus which are used in various technical fields.

When measuring biological magnetic fields with the SQUID, magnetic flux values at plural points which exist in a predetermined plane are measured by using plural SQUID flux meters, then magnetic flux values at all points within the plane are obtained by performing interpolation processings based on the measured magnetic flux, the interpolation processings being linear interpolation processings, spline interpolation processings or least square processings by least square method. Thereafter, after-treatment such as arrow-map display, analysis of magnetic sources and the like is performed based on the magnetic flux at all points thus obtained.

The linear interpolation processings have advantages such as lesser calculation load and higher processing speed. But the linear interpolation processings have disadvantages such that interpolation results between the measured points are decreased in accuracy and isomagnetic contour lines are displayed as kinked lines when the display is required. The linear interpolation processings have a further disadvantage that applicable usage is limited to cases which do not need arrow-map display because partial differential values cannot be obtained based on interpolation results obtained by linear interpolation processings, the partial differential values being necessary for arrow-map display.

The interpolation processings using spline interpolation or least square method can eliminate the above-mentioned disadvantages of the linear interpolation processings because the interpolation processings using spline interpolation or least square method can interpolate a curved surface. The interpolation processings using spline interpolation or least square method have disadvantages such that the calculation load is remarkably increased more than the linear interpolation processings, real time magnetic field measurement and real time magnetic field display are impossible to perform. More specifically, a computer which has a large capacity and high processing speed is needed because calculation load is remarkably increased. And real time magnetic field measurement and real time magnetic field display are impossible to perform even when a computer having a large capacity and high processing speed is employed. Furthermore, when partial differential values which are necessary for arrow-map display, are to be calculated, magnetic flux should be obtained by interpolation processings, then partial differential values should be calculated based on the obtained magnetic flux by numerical differential method, thereby the necessary time period for obtaining partial differential values is lengthened remarkably.

SUMMARY OF THE INVENTION

It is an object of the present invention to simplify processings of curved surface interpolation between points where magnetic flux are measured and to improve the operation speed for the curved surface interpolation processings.

It is another object of the present invention to simplify processing for obtaining partial differential values at arbitrary points and to improve the operation speed for the processing.

It is a further object of the present invention to simplify processing for displaying magnetic field and to improve the operation speed for the processing.

In order to achieve the objects above-mentioned, a magnetic field measurement method according to the present invention comprises the steps of;

measuring magnetic flux at plural points which correspond to two dimensional grids using plural SQUID flux meters, and interpolating magnetic flux between measured points by convoluting sampling unit functions in each direction of the two dimensional grids to the measured magnetic flux.

According to the magnetic field measurement method, a surface including plural points can be expressed by one numerical formula. And magnetic flux at all points can be obtained through calculating each value of each point based on the numerical formula. Consequently, the magnetic field measuring method greatly decreases the calculation load and greatly improves the operation speed of the interpolation processings compared with the conventional interpolation processings such as spline interpolation and least square method which cannot express a surface with one numerical formula.

A magnetic field measurement apparatus according to the present invention comprises;

plural SQUID flux meters for measuring the magnetic flux at plural points which correspond to two dimensional grids, interpolation function obtaining means for obtaining an interpolation function by convoluting sampling unit functions in each direction of the two dimensional grids to the measured magnetic flux, and magnetic flux calculating means for calculating magnetic flux at an arbitrary point between the measured points based on the obtained interpolation function.

According to the magnetic field measurement apparatus, magnetic flux at plural points which correspond to two dimensional grids are measured by the plural SQUID flux meters, the measured magnetic flux are convoluted by the sampling unit functions in each direction of the two dimensional grids to obtain the interpolation function by the interpolation function obtaining means, then the magnetic flux at an arbitrary point between the measured points is calculated by the magnetic flux calculating means based on the obtained interpolation function. In this case, the interpolation function is obtained at high speed when the sampling unit functions are previously calculated and stored in a table. The magnetic flux at an arbitrary point between the measured points are accordingly calculated at high speed.

A magnetic field display method according to the present invention comprises the steps of;

measuring magnetic flux at plural points which correspond to two dimensional grids using plural SQUID flux meters, flux meters, interpolating magnetic flux between measured points by convoluting sampling unit functions in each direction of the two dimensional grids to the measured magnetic flux, and displaying the magnetic field based on the measured magnetic flux and the interpolation magnetic flux.

According to the magnetic field display method, a surface including plural points can be expressed by one numerical formula. And magnetic flux at all points can be obtained through calculating each value of each point based on the numerical formula. Then, the magnetic field is displayed based on the obtained magnetic flux.

The magnetic field may be displayed with isomagnetic contour lines based on the measured magnetic flux and the interpolation magnetic flux. The displayed magnetic field is accordingly easy to recognize.

A magnetic field display apparatus according to the present invention comprises;

plural SQUID flux meters for measuring magnetic flux at plural points which correspond to two dimensional grids, interpolation function obtaining means for obtaining an interpolation function by convoluting sampling unit functions in each direction of the two dimensional grids to the measured magnetic flux, magnetic flux calculating means for calculating magnetic flux at an arbitrary point between the measured points based on the obtained interpolation function, and isomagnetic contour line generating means for generating isomagnetic contour lines based on the calculated magnetic flux, each isomagnetic contour line consisting of points which have the same magnetic flux one another.

According to the magnetic field display apparatus, the magnetic flux at plural points which correspond to two dimensional grids are measured by the plural SQUID flux meters, the measured magnetic flux are convoluted by the sampling unit functions in each direction of the two dimensional grids to obtain the interpolation function by the interpolation function obtaining means, then magnetic flux at an arbitrary point between the measured points is calculated by the magnetic flux calculating means based on the obtained interpolation function. Thereafter, isomagnetic contour lines are generated by the isomagnetic contour line generating means based on the measured and obtained magnetic flux. The displayed magnetic field is accordingly easy to recognize.

Another magnetic field measurement method according to the present invention comprises the steps of;

measuring magnetic flux at plural points which correspond to two dimensional grids using plural SQUID flux meters, and interpolating magnetic flux between measured points by convoluting a sampling unit function in one direction of the two dimensional grids and a function obtained by differentiating a sampling unit function in the other direction of the two dimensional grids to the measured magnetic flux.

According to the magnetic field measurement method, the partial differential value of the magnetic flux at an arbitrary point is easily obtained even when the magnetic flux is not previously obtained based on the interpolation function. An arrow-map display and the like can easily be obtained based on the obtained partial differential values.

Another magnetic field measurement apparatus according to the present invention comprises;

plural SQUID flux meters for measuring magnetic flux at plural points which correspond to two dimensional grids, interpolation function obtaining means for obtaining an interpolation function by convoluting a sampling unit function in one direction of the two dimensional grids and a function obtained by differentiating a sampling unit function in the other direction of the two dimensional grids to the measured magnetic flux, partial defferential value calculating means for calculating a partial differential value of magnetic flux at an arbitrary point between the measured points based on the obtained interpolation function.

According to the magnetic field measurement apparatus, magnetic flux at plural points which correspond to two dimensional grids are measured by the plural SQUID flux meters, the measured magnetic flux are convoluted by the sampling unit function in one direction of the two dimensional grids and the function obtained by differentiating the sampling unit function in the other direction of the two dimensional grids to obtain the interpolation function by the interpolation function obtaining means, then the partial differential value of the magnetic flux at an arbitrary point between the measured points is calculated by the partial differential value calculating means based on the obtained interpolation function. Summarizing the above, partial differential values of magnetic flux at arbitrary points can easily be calculated even when the magnetic flux at the arbitrary points are not previously obtained based on the interpolation function. Accordingly, an arrow-map display and the like can easily be obtained based on the obtained partial differential values.

These and other objectives, features and advantages of the present invention will be more readily understood upon consideration of the present invention, in conjunction with the accompanying drawings.

DETAILED DESCRIPTION OF THE PREFERRED EMBODIMENTS

Figure 1:
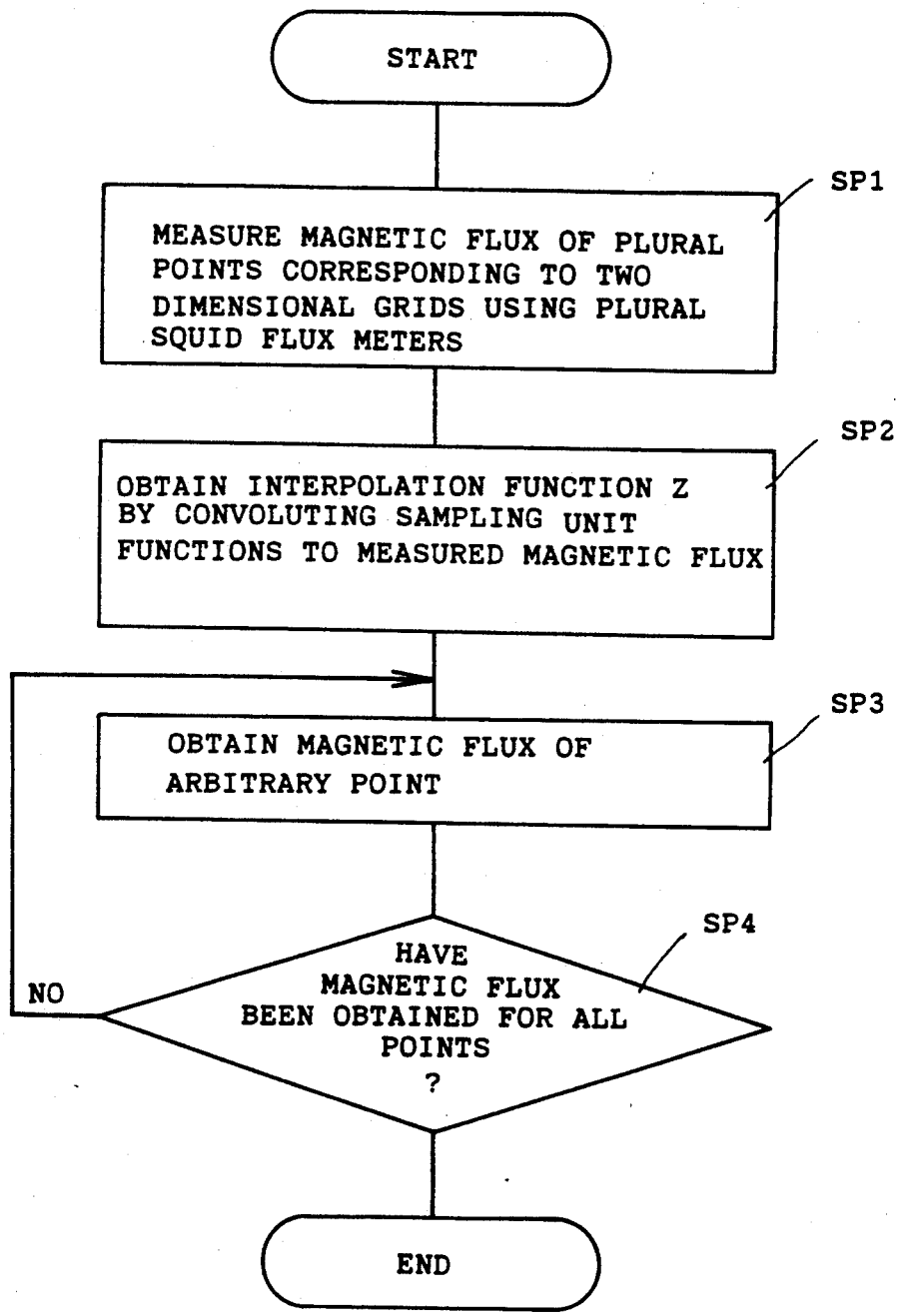
FIG. 1 is a flowchart for an embodiment of a magnetic field measurement method according to the present invention.
Figure 2:
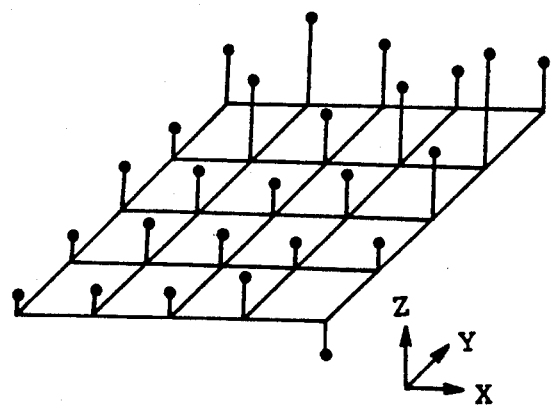
FIGS. 2(A), 2(B) and 2(C) are diagrams useful in understanding operations of a magnetic field measurement method based on a specific example.
Figure 2:
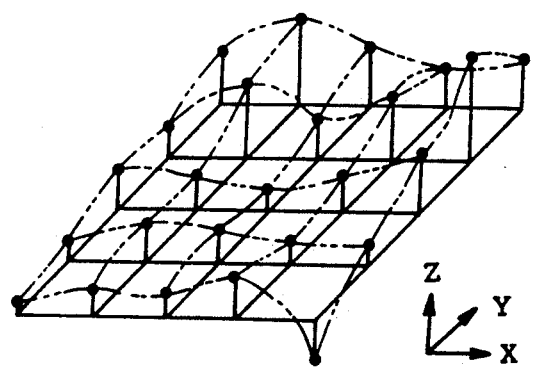
Figure 2:
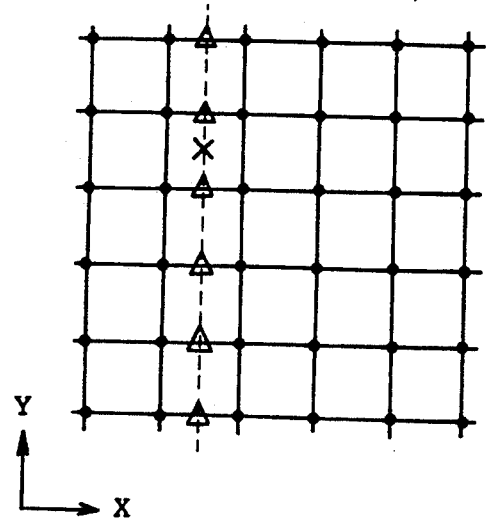

FIG. 1 is a flowchart for an embodiment of a magnetic field measurement method according to the present invention, while FIGS. 2(A), 2(B) and 2(C) are diagrams useful in understanding operations of the magnetic field measurement method based on a specific example.

In step SP1, the magnetic flux at plural points which correspond to two dimensional grids are measured by plural SQUID flux meters (refer to FIG. 2(A)). In step SP2, a function f(x, y) which treats the magnetic flux measured at specific time as impulse response, is convoluted by sampling unit functions $(\sin \pi x)/\pi x$, and $(\sin \pi y)/\pi y$ in each direction (x-direction and y-direction) of the two dimensional grids to obtain an interpolation function which is expressed by the following equation.

$$z(x, y) = h(x, y) = f(x, y) * \{(\sin \pi x)/\pi x\} * \{(\sin \pi y)/\pi y\}$$

(Where "*" indicates a symbol of convolution operation.) The sampling unit functions $(\sin \pi x)/\pi x$, and $(\sin \pi y)/\pi y$ are employed instead of sampling unit functions $(\sin x)/x$, and $(\sin y)/y$ so as to establish the distance of "1" between the measured points which correspond to the two dimensional grids. In step SP3, an operation of $$z = \sum_{i=0}^{n-1} \left[ \{(\sin \pi(y-i)/\pi(y-i)\} \cdot \sum_{j=0}^{m-1} \{(\sin \pi(x-j)/\pi(x-j)\} \cdot f(i,j) \right]$$

(Where n indicates a number of measurement points in y-direction of the two dimensional grids, while m indicates a number of measurement points in x-direction of the two dimensional grids) is carried out based on the interpolation function so as to obtain the magnetic flux at an arbitrary point (refer to a two dots and dash line in FIG. 2(B)). More specifically with reference to FIG. 2(C), an arbitrary line in the x-direction of the two dimensional grids is selected, magnetic flux at an arbitrary point (refer to triangle mark in FIG. 2(C)) is obtained based on the measured magnetix flux on the selected line (refer to circle mark in FIG. 2(C)), then the magnetic flux at an arbitrary point (refer to "X" mark in FIG. 2(C)) based on the obtained magnetic flux on a line in y-direction of the two dimensional grids (refer to triangle mark in FIG. 2(C)) which line includes the arbitrary point of the line in x-direction. As a result, operation speed is improved.

Then in step SP4, it is judged whether or not the magnetic flux at all points which are needed for processings, have been obtained. When it is judged that the magnetic flux at some points have not been obtained, the operation in step SP3 is carried out again. In contrast, when it is judged that the magnetic flux at all points have been obtained, the series of operations are finished.

When this embodiment is employed, the magnetic flux can be interpolated with high accuracy for the entire extent of a region corresponding to the two dimensional grids which are regulated by the plural SQUID flux meters, by carrying out the series of operations. The function f(x, y) has a value only when "x" and "y" are integers. The function f(x, y) also has a value within a measured extent. The sampling unit functions $(\sin \pi x)/\pi x$ and $(\sin \pi y)/\pi y$ are accordingly sufficient to previously obtain values for x and y within the extent of measurement and at every distance of a required resolution for the interpolation. The operation speed is accordingly improved by previously obtaining the values for the necessary cycles.

Second Embodiment

Figure 3:
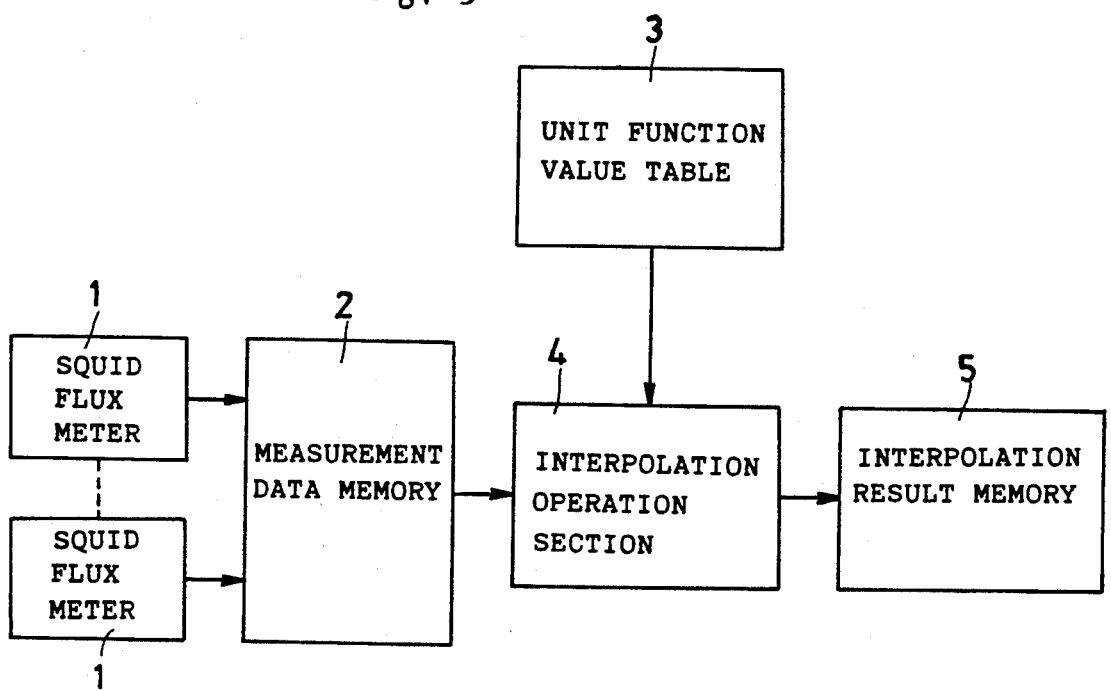
FIG. 3 is a block diagram showing an embodiment of a magnetic field measurement apparatus according to the present invention.

FIG. 3 is a block diagram showing an embodiment of a magnetic field measurement apparatus according to the present invention.

The magnetic field measurement apparatus comprises;

plural SQUID flux meters 1 for measuring magnetic flux at plural points which correspond to two dimensional grids, a measurement data memory 2 for temporarily storing magnetic flux measurement data f(x, y) which are output from the SQUID flux meters 1, a unit function value table 3 for storing values of sampling unit functions $(\sin \pi x)/\pi x$, and $(\sin \pi y)/\pi y$, an interpolation operation section 4 for sequentially reading data out from the measurement data memory 2 and the unit function value table 3 and for carrying out the operation of $$z = \sum_{i=0}^{n-1} \left[ \{(\sin \pi(y-i)/\pi(y-i)\} \cdot \sum_{j=0}^{m-1} \{(\sin \pi(x-j)/\pi(x-j)\} \cdot f(i,j) \right]$$

based on the read out data, and an interpolation result memory 5 for temporarily storing the interpolation operation results.

In this embodiment, a dc-SQUID having high sensitivity for magnetic flux detection is employed as the SQUID flux meter 1. A magnetic flux locked loop is incorporated with the dc-SQUID so as to maintain magnetic flux which is guided into a superconducting loop of the dc-SQUID, at a trough of a magnetic flux-voltage characteristic, and to output an integration value of output voltages output from the dc-SQUID as a magnetic flux detection signal. The magnetic flux may be locked at a crest or an arbitrary point of a monotonic varying portion of the magnetic flux-voltage characteristic.

When this embodiment is employed, magnetic flux can be interpolated with high accuracy for the entire extent of a region corresponding to the two dimensional grids which are regulated by the plural SQUID flux meters. The interpolation operation is carried out at high speed because the sampling unit functions (sin $\pi x)/\pi x$, and (sin $\pi y)/\pi y$ are previously obtained values for the necessary cycles and are stored in the unit function value table 3.

Third Embodiment

Figure 4:
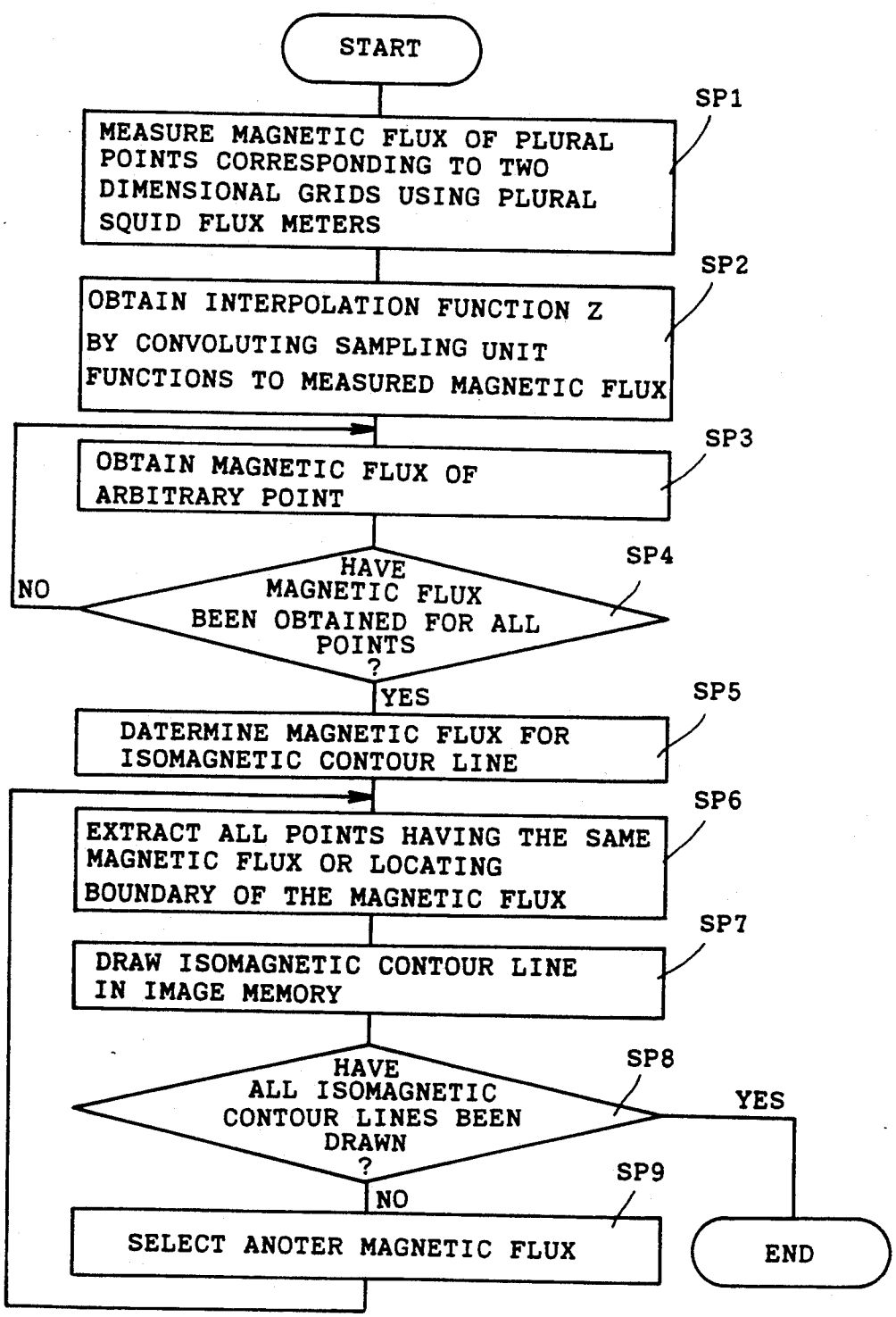
FIG. 4 is a flowchart for an embodiment of a magnetic field display method according to the present invention.

FIG. 4 is a flowchart for an embodiment of a magnetic field display method according to the present invention.

In step SP1, the magnetic flux at plural points which correspond to two dimensional grids are measured by plural SQUID flux meters. In step SP2, a function f(x, y) which treats the magnetic flux measured at specific times as impulse response, is convoluted by sampling unit functions (sin $\pi x)/\pi x$, and (sin $\pi y)/\pi y$ in each direction (x-direction and y-direction) of the two dimensional grids to obtain an interpolation function which is expressed by the following equation.

$$z(x,y) = h(x,y) = f(x,y)*\{(\sin \pi x)/\pi x\}*\{(\sin \pi y)/\pi y\}$$

In step SP3, an operation of $$z = \sum_{i=0}^{n-1} \left[ \{(\sin \pi(y-i)/\pi(y-i)\} \cdot \sum_{j=0}^{m-1} \{(\sin \pi(x-j)/\pi(x-j)\} \cdot f(i,j) \right]$$

is carried out based on the interpolation function so as to obtain the magnetic flux at an arbitrary point. Then in step SP4, it is judged whether or not the magnetic flux at all points which are needed for processing, have been obtained. When it is judged that the magnetic flux at some points have not been obtained, the operation in step SP3 is carried out again. In contrast, when it is judged that the magnetic flux at all points have been obtained, in step SP5, magnetic flux are determined which are used for isomagnetic contour lines, in step SP6, all points (x, y) are extracted which have the same magnetic flux as one of the determined magnetic flux or which are located in a boundary of the determined magnetic flux, in step SP7, an isomagnetic contour line is drawn in a image memory based on all the extracted points, in step SP8, it is judged whether or not isomagnetic contour lines have been drawn in the image memory with respect to all the determined magnetic flux. When it is judged in step SP8 that isomagnetic contour lines with respect to some of the determined magnetic flux have not been drawn in the image memory, in step SP9, another determined magnetic flux is selected, then the operation in step SP6 is carried out again. Then, when it is judged in step SP8 that isomagnetic contour lines with respect to all the determined magnetic flux have been drawn in the image memory, the series of operations are finished.

Figure 5:
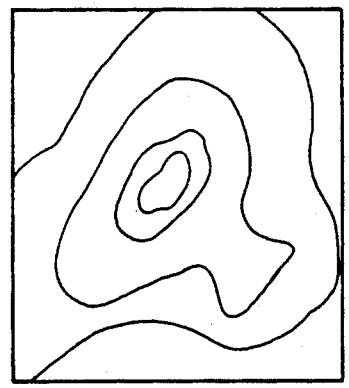
FIG. 5 is a diagram showing a display example of isomagnetic contour lines.

When this embodiment is employed, display with the isomagnetic contour lines (refer to FIG. 5) can easily be performed based on the obtained magnetic flux for all points. The magnetic field measurement results are accordingly displayed easily recognizable and accurately because the isomagnetic contour lines are faithful to the actual distribution of magnetic flux.

Fourth Embodiment

Figure 6:
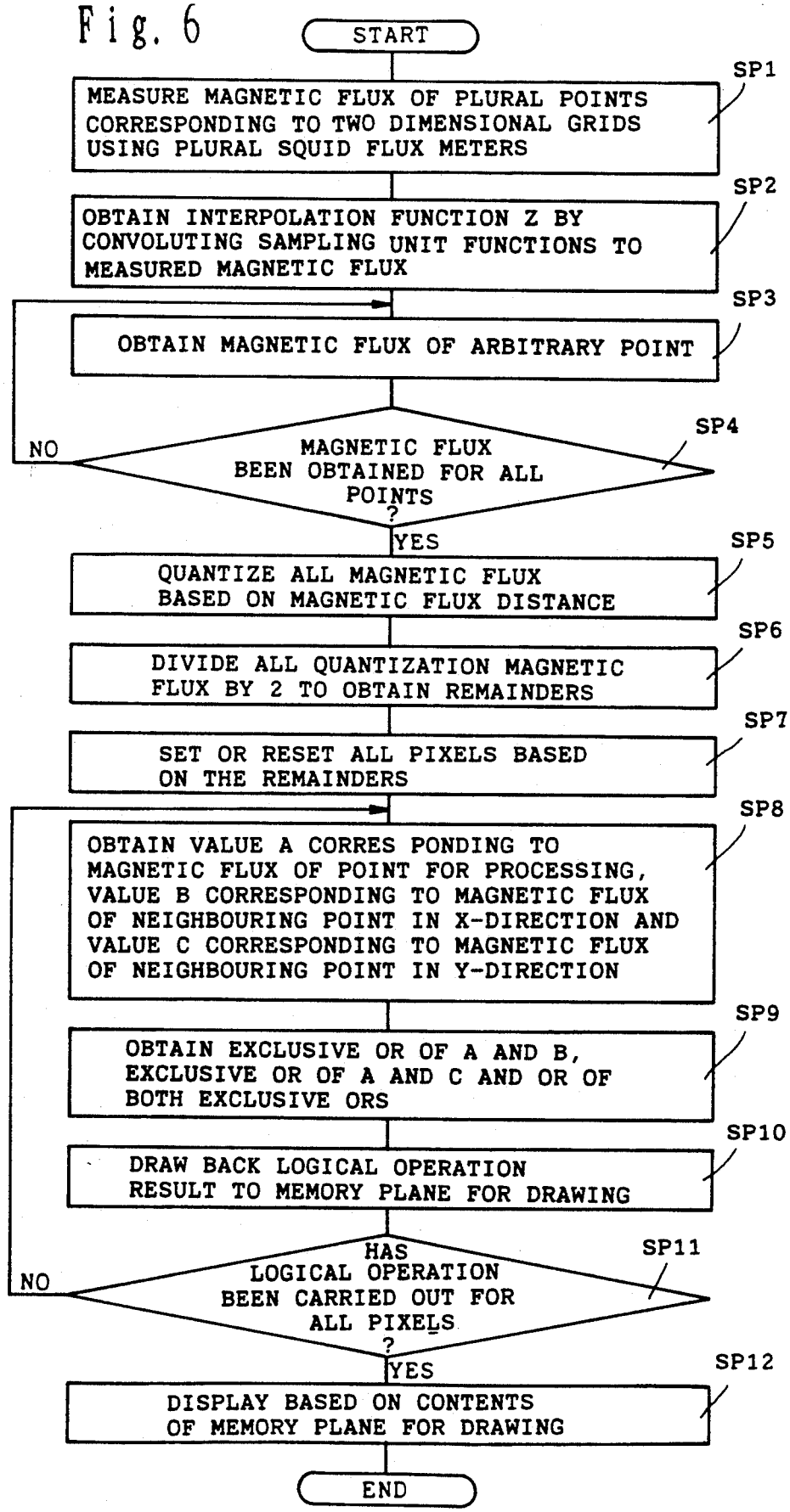
FIG. 6 is a flowchart for another embodiment of a magnetic field display method according to the present invention.

FIG. 6 is a flowchart for another embodiment of a magnetic field display method according to the present invention.

In step SP1, the magnetic flux at plural points which correspond to two dimensional grids are measured by plural SQUID flux meters. In step SP2, a function f(x, y) which treats the magnetic flux measured at specific time as impulse response, is convoluted by sampling unit functions (sin $\pi x)/\pi x$, and (sin $\pi y)/\pi y$ in each direction (x-direction and y-direction) of the two dimensional grids to obtain an interpolation function which is expressed by the following equation.

$$z(x,y) = h(x,y) = f(x,y)*\{(\sin \pi x)/\pi x\}*\{(\sin \pi y)/\pi y\}$$

In step SP3, an operation of $$z = \sum_{i=0}^{n-1} \left[ \{(\sin \pi(y-i)/\pi(y-i)\} \cdot \sum_{j=0}^{m-1} \{(\sin \pi(x-j)/\pi(x-j)\} \cdot f(i,j) \right]$$

is carried out based on the interpolation function so as to obtain the magnetic flux at an arbitrary point. Then in step SP4, it is judged whether or not the magnetic flux at all points which are needed for processing, have been obtained. When it is judged that the magnetic flux at some points have not been obtained, the operation in step SP3 is carried out again. However, when it is judged that the magnetic flux at all points have been obtained, in step SP5, all the obtained all magnetic flux data are quantized based on a magnetic flux distance for isomagnetic contour line display, in step SP6, all the quantized magnetic flux are divided by 2 so as to obtain remainders, in step SP7, all pixels of a memory plane for drawing are set or reset based on the obtained remainders. For example, a pixel is set to "1" when the remainder thereof is 0 and a pixel is reset to "0" when the remainder thereof is 1. Then, in step SP8, a value A corresponding to magnetic flux at a point which is an object for processing, a value B corresponding to magnetic flux at a neighbouring point in x-direction to the point and a value C corresponding to magnetic flux at a neighbouring point in y-direction to the point are obtained (refer to FIG. 7(A)), in step SP9, exclusive OR of A and B and exclusive OR of A and C are obtained, then OR of both the exclusive ORs is obtained, in step SP10, the obtained logical operation result is drawn back to the memory plane for drawing, in step SP11, it is judged whether or not the logical operation has been carried out for all the pixels. When it is judged that the logical operation has not been carried out for some pixels, the operation in step SP8 is carried out again. However, when it is judged that the logical operation has been carried out for all pixels, in step SP12, display is performed based on the content of the memory plane for drawing, and then the series of operations are finished.

Figure 7:
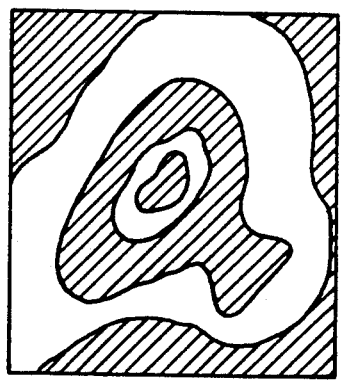
FIGS. 7(A) and 7(B) are diagrams useful in understanding operations of a magnetic field display method.

When this embodiment is employed, the magnetic flux at all points are quantized to obtain quantization results, the quantization results are divided by 2 to obtain remainders, then pixels are set or reset in correspondence with the remainders to obtain a condition (a specific condition is illustrated in FIG. 7(B)). Pixels on isomagnetic contour lines can easily be extracted by performing logical operations based on each pixel illustrated in FIG. 7(B) for example, so as to simplify the processings remarkably and improve the processing speed.

Fifth Embodiment

Figure 8:
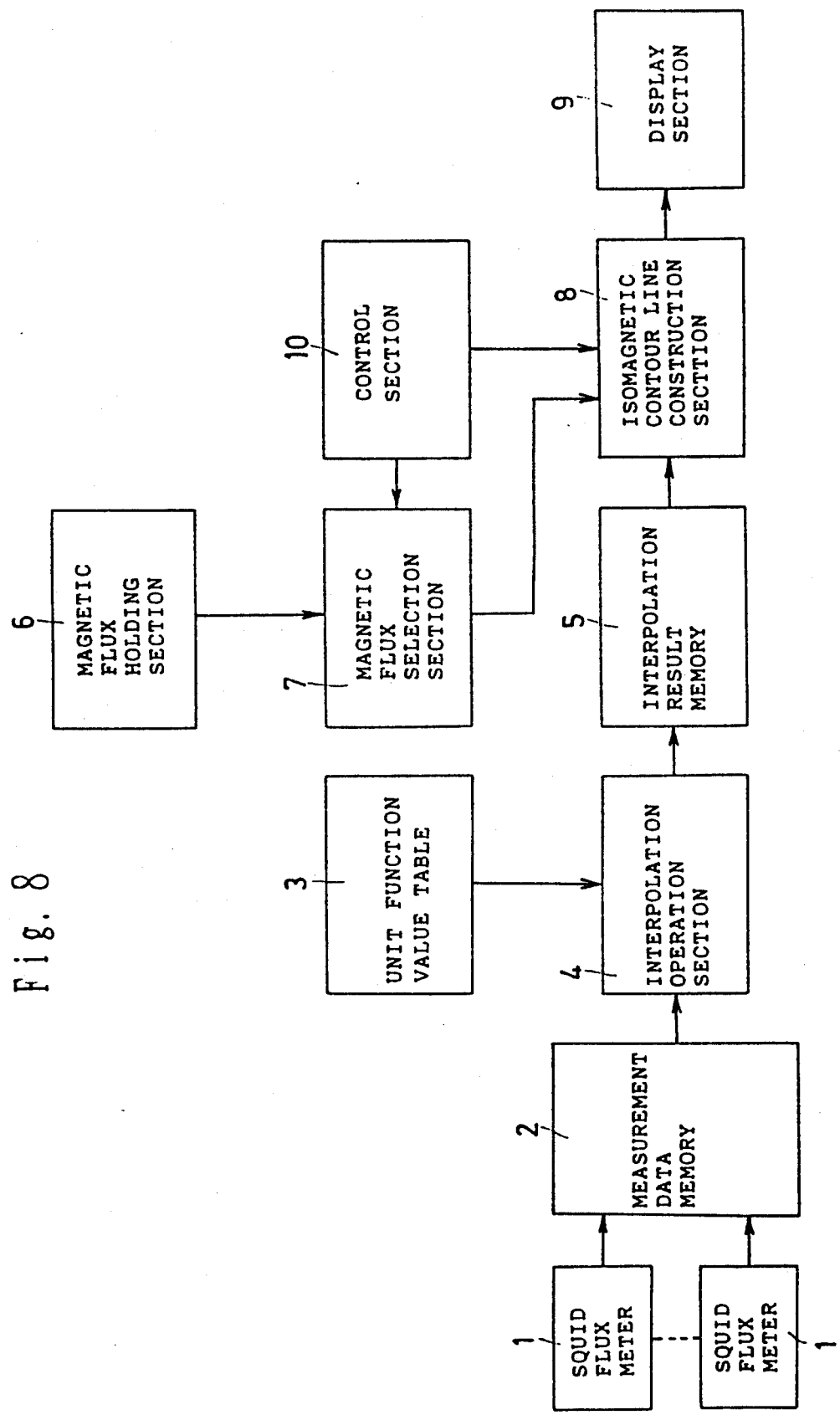
FIG. 8 is a block diagram showing an embodiment of a magnetic field display apparatus according to the present invention.

FIG. 8 is a block diagram showing an embodiment of a magnetic field display apparatus according to the present invention.

The magnetic field display apparatus comprises;

plural SQUID flux meters 1 for measuring magnetic flux at plural points which correspond to two dimensional grids, a measurement data memory 2 for temporarily storing magnetic flux measurement data f(x, y) which are output from the SQUID flux meters 1, a unit function value table 3 for storing values of sampling unit functions (sin $\pi$x)/$\pi$x, and (sin $\pi$y)/$\pi$y, an interpolation operation section 4 for sequentially reading data out from the measurement data memory 2 and the unit function value table 3 and for carrying out the operation of $$z = \sum_{i=0}^{n-1} \left[ \{(\sin \pi(y-i)/\pi(y-i)\} \cdot \sum_{j=0}^{m-1} \{(\sin \pi(x-j)/\pi(x-j)\} \cdot f(i,j) \right]$$

based on the read out data, an interpolation result memory 5 for temporarily storing the interpolation operation results, a magnetic flux holding section 6 for holding plural magnetic flux which are previously determined for displaying isomagnetic contour lines, a magnetic flux selection section 7 for selecting and reading out one of the magnetic flux held in the magnetic flux holding section 6, an isomagnetic contour line construction section 8 for extracting interpolation operation results which are the same as the read out magnetic flux or which locate in a boundary of the read out magnetic flux, and for constructing an isomagnetic contour line based on the extracted interpolation operation results, a display section 9 for displaying the constructed isomagnetic contour lines, and a control section 10 for repetitively operating the magnetic flux selection section 7 and the isomagnetic contour line construction section 8 for a necessary number of times.

When this embodiment is employed, accurate interpolation data are obtained based on the interpolation function which is obtained by convoluting sampling unit functions to the measured magnetic flux. Then, isomagnetic contour lines are displayed by extracting the points which have the same magnetic flux as the magnetic flux determined for display with isomagnetic contour lines or which are located in the boundary of the magnetic flux determined for display with isomagnetic contour lines, out from the obtained interpolation data. As a result, displays with isomagnetic contour lines are performed more easily and accurately.

Sixth Embodiment

Figure 9:
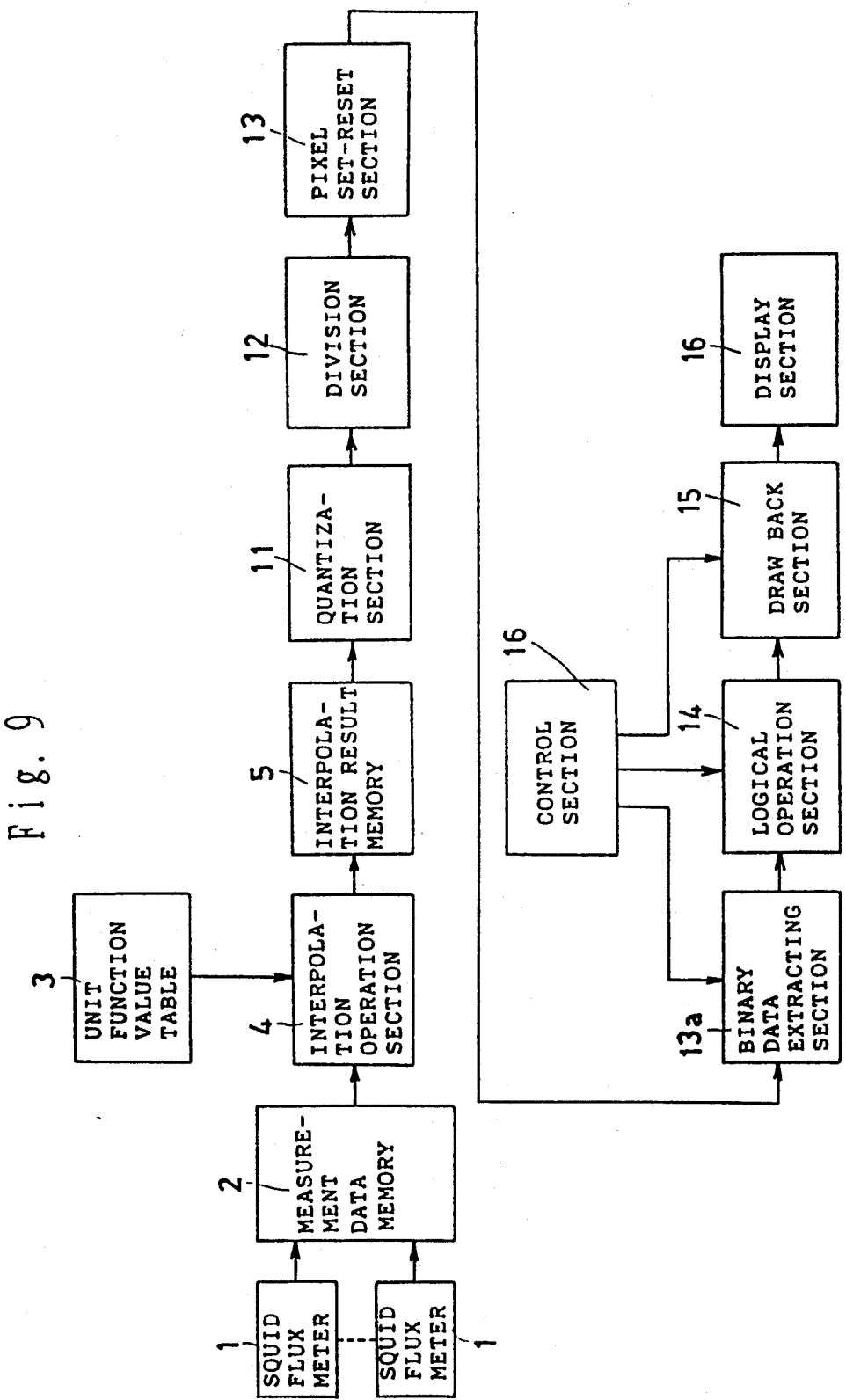
FIG. 9 is a block diagram showing another embodiment of a magnetic field display apparatus according to the present invention.

FIG. 9 is a block diagram showing another embodiment of a magnetic field display apparatus according to the present invention.

The magnetic field display apparatus comprises;

plural SQUID flux meters 1 for measuring magnetic flux at plural points which correspond to two dimensional grids, a measurement data memory 2 for temporarily storing magnetic flux measurement data f(x, y) which are output from the SQUID flux meters 1, a unit function value table 3 for storing values of sampling unit functions (sin $\pi$x)/$\pi$x, and (sin $\pi$y)/$\pi$y, an interpolation operation section 4 for sequentially reading data out from the measurement data memory 2 and the unit function value table 3 and for carrying out the operation of $$z = \sum_{i=0}^{n-1} \left[ \{(\sin \pi(y-i)/\pi(y-i)\} \cdot \sum_{j=0}^{m-1} \{(\sin \pi(x-j)/\pi(x-j)\} \cdot f(i,j) \right]$$

based on the read out data, an interpolation result memory 5 for temporarily storing the interpolation operation results, a quantization section 11 for quantizing the interpolation operation results based on a magnetic flux distance for isomagnetic contour line display, a division section 12 for dividing the quantization results by 2 to obtain remainders, a pixel set-reset section 13 for setting pixels in a memory plane for drawing to "1" or for resetting pixels in a memory plane for drawing to "0" based on the obtained remainders, a binary data extracting section 13a for extracting a pixel A corresponding to the magnetic flux at a point which is an object for processing, a pixel B corresponding to the magnetic flux at a neighbouring point in x-direction to the point and a pixel C corresponding to the magnetic flux at a neighbouring point in y-direction to the point, a logical operation section 14 for obtaining exclusive OR of pixels A and B and exclusive OR of pixels A and C and for obtaining OR of both the exclusive ORs, a draw back section 15 for drawing back the obtained logical operation result to the memory plane for drawing, a control section 16 for repetitively operating the binary data extracting section 13a, the logical operation section 14 and the draw back section 15, and a display section 17 for displaying isomagnetic contour lines based on the content of the memory plane for drawing.

When this embodiment is employed, it is sufficient for displaying isomagnetic contour lines that each pixel is transformed into a binary value at every magnetic flux distance for isomagnetic contour line display, and that logical operation is carried out based on the transformed binary values.

Seventh Embodiment

Figure 10:
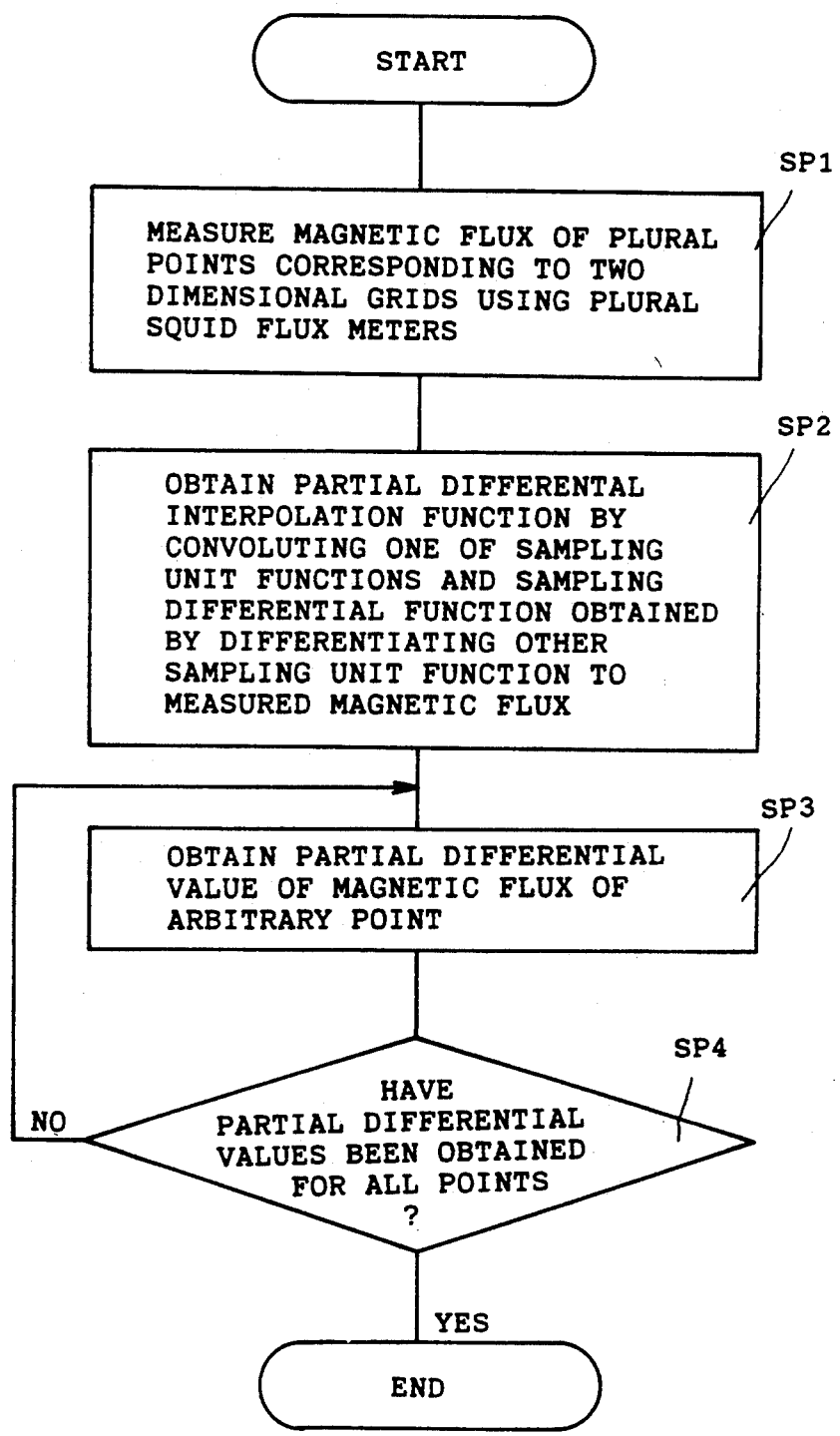
FIG. 10 is a flowchart for another embodiment of a magnetic field measurement method according to the present invention.

FIG. 10 is a flowchart for another embodiment of a magnetic field measurement method according to the present invention.

This embodiment differs from the first embodiment in that a sampling differential function $d\{(\sin \pi x)/\pi x\}/dx = (x \cos x - \sin x)/x^2$ or $d\{(\sin \pi y)/\pi y\}/dy = (y \cos y - \sin y)/y^2$ which is obtained by differentiating one of the sampling unit functions, instead of the corresponding sampling unit function, is convoluted to the measured magnetic flux so as to obtain a partial differential interpolation function $\delta h(x, y)/\delta x$ or $\delta h(x, y)/\delta y$.

When this embodiment is employed, a partial differential value of each point, instead of a magnetic flux at the corresponding point, is obtained easily and accurately. As a result, gradient diffusion and the like for magnetic flux can be measured. Further, magnetic field analysis and the like can be performed using the partial differential values.

Eighth Embodiment

Figure 11:
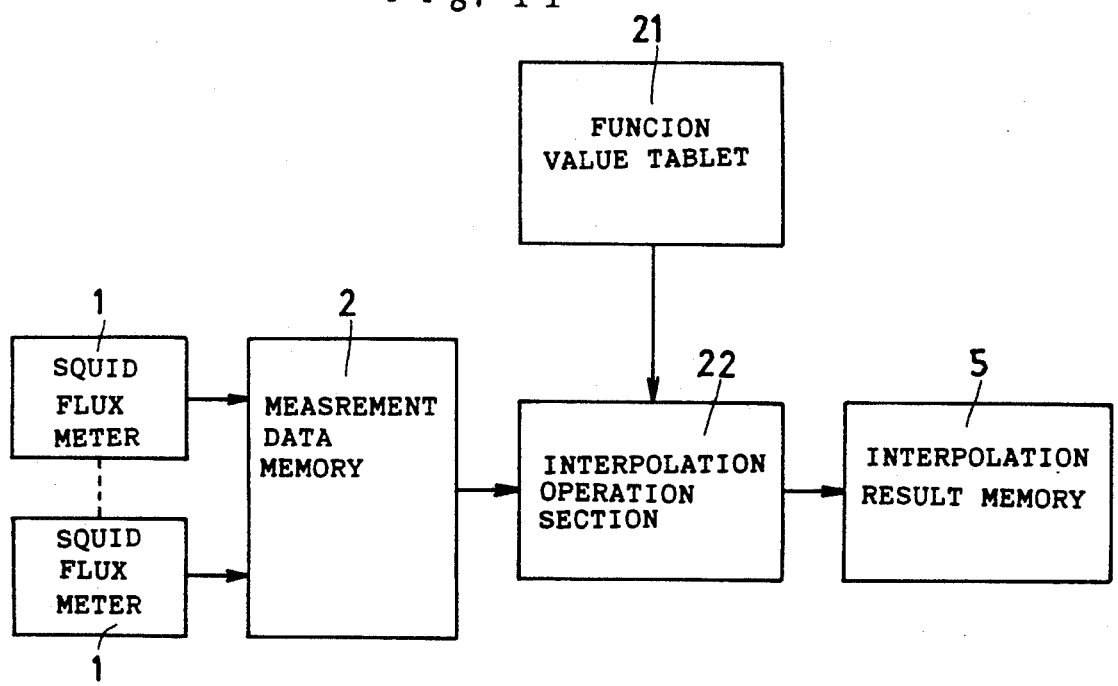
FIG. 11 is a block diagram showing another embodiment of a magnetic field measurement apparatus according to the present invention.

FIG. 11 is a block diagram showing another embodiment of a magnetic field measurement apparatus according to the present invention.

The magnetic field measurement apparatus differs from the second embodiment in the following points;

a function value table 21 for storing values of sampling differential functions $(x \cos x - \sin x)/x^2$ and $(y \cos y - \sin y)/y^2$ additionally to values of sampling unit functions $(\sin \pi x)/\pi x$ and $(\sin \pi y)/\pi y$ is provided instead of the unit function value table 3, and an interpolation operation section 22 is provided instead of the interpolation operation section 4. The interpolation operation section 22 sequentially reads measurement data out from the measurement data memory 2 and reads out values of $(\sin \pi x)/\pi x$ and $(y \cos y - \sin y)/y^2$ or reads out values of $(\sin \pi y)/\pi y$ and $(x \cos x - \sin x)/x^2$ from the function value table 21, and carries out the operation of $$\delta z/\delta y = \sum_{i=0}^{n-1}\left[\{[(y-i)\cos(y-i) - \sin(y-i)]/(y-i)^2\} \cdot \sum_{j=0}^{m-1}\{(\sin \pi(x-j)/\pi(x-j)\} \cdot f(i,j)\right]$$

or $$\delta z/\delta x = \sum_{i=0}^{n-1}\left[\{\sin \pi(y-i)/\pi(y-i)\} \cdot \sum_{j=0}^{m-1}\left[\{((x-j)\cos(x-j) - \sin(x-j))/(x-j)^2\} \cdot f(i,j)\right]\right]$$

When this embodiment is employed also, a partial differential value of each point, instead of a magnetic flux at the corresponding point, is obtained easily and accurately. As a result, gradient diffusion and the like for magnetic flux can be measured. Further, magnetic field analysis and the like can be performed using the partial differential values.

The terms and expressions which have been employed here are used as terms of description and not of limitation, and there is no intention, in the use of such terms and expressions of excluding equivalents of the features shown and described, or portions thereof, it being recognized that various modifications are possible within the scope of the invention claimed.

What is claimed is:

1. A method of measuring a magnetic field by measuring magnetic flux at points within the field, said method comprising the steps of:

measuring magnetic flux at plural points which correspond to two dimensional grids using plural SQUID flux meters to provide data signals representative of measured magnetic flux at the plural points, and interpolating to provide flux interpolation data representative of magnetic flux between the plural points, said step of interpolating including convoluting sampling unit function data relating to both directions of the two dimensional grids with the data signals representative of measured magnetic flux.

2. A magnetic field measurement apparatus comprising;

plural SQUID flux meters for measuring magnetic flux at plural points which correspond to two dimensional grids and providing data signals representative of measured magnetic flux at said points, interpolation function obtaining means for obtaining interpolation function data representative of an interpolation function by convoluting sampling unit function data relating to both directions of said two dimensional grids with the data signals representative of measured magnetic flux, and magnetic flux calculating means for calculating magnetic flux data representative of magnetic flux at an arbitrary point between the measured points based on the interpolation function data.

3. A magnetic field display method comprising the steps of;

measuring magnetic flux at plural points which correspond to two dimensional grids using plural SQUID flux meters to provide data signals representative of measured magnetic flux at said plural points, interpolating to provide flux interpolation data representative of magnetic flux between the plural points, said step of interpolating including convoluting sampling unit function data relating to both directions of the two dimensional grids with the data signals representative of measured magnetic flux, and displaying a magnetic field based on the data signals representative of measured magnetic flux and the flux interpolation data.

4. A magnetic field display method as set forth in claim 3, wherein the magnetic field is displayed by isomagnetic contour lines based on the data signals representative of measured magnetic flux and the flux interpolation data.

5. A magnetic field display method as set forth in claim 4, further comprising the steps of, classifying all points based on the data signals representative of measured magnetic flux and the flux interpolation data into plural groups which are determined based on determined magnetic flux for isomagnetic contour lines, and extracting the points which have the same magnetic flux as the magnetic flux determined for display with isomagnetic contour lines or which are located in the boundary of the magnetic flux determined for display with the isomagnetic contour lines.

6. A magnetic field display method as set forth in claim 4, further comprising the steps of, quantizing the data signals representative of measured magnetic flux and the flux interpolation data based on a magnetic flux distance for isomagnetic contour lines display to provide quantized magnetic flux data, dividing the quantized magnetic flux data at all pixels by 2 to obtain remainders, setting or resetting pixels based on the remainders, obtaining an exclusive OR of a value of an object pixel which is an object for processing and a value of a neighboring pixel in one direction with respect to the object pixel, and an exclusive OR of the value of the object pixel and a value of a neighboring pixel in the other direction with respect to the object pixel, obtaining an OR of both the obtained exclusive ORs, and drawing back the obtained OR to a memory plane for drawing.

7. A magnetic field display apparatus comprising;

plural SQUID flux meters for measuring magnetic flux at plural points which correspond to two dimensional grids and providing data signals representative of measured magnetic flux at the points, interpolation function obtaining means for obtaining interpolation function data representative of an interpolation function by convoluting sampling unit function data relating to both directions of said two dimensional grids with the data signals representative of measured magnetic flux, magnetic flux calculating means for calculating magnetic flux data representative of magnetic flux at an arbitrary point between the measured points based on said interpolation function, and isomagnetic contour line generating means for generating isomagnetic contour lines based on the calculated magnetic flux data, each isomagnetic contour line consisting of points which have the same magnetic flux as one another.

8. A magnetic field display apparatus as set forth in claim 7, said isomagnetic contour line generating means comprising, classifying means for classifying all points based on the data signals representative of measured magnetic flux and the calculated magnetic flux data into plural groups which are determined based on determined magnetic flux for isomagnetic contour lines, and extracting means for extracting the points which have the same magnetic flux as the magnetic flux determined for display with isomagnetic contour lines or which are located in the boundary of the magnetic flux determined for display with the isomagnetic contour lines.

9. A magnetic field display apparatus as set forth in claim 7, said isomagnetic contour line generating means comprising, quantizing means for quantizing the data signals representative of the measured magnetic flux and the calculated magnetic flux data based on a magnetic flux distance for isomagnetic contour line display to provide quantized magnetic flux data, dividing means for dividing the quantized magnetic flux data at all points by 2 to obtain remainders, setting-resetting means for setting or resetting the points based on the remainders, first obtaining means for obtaining an exclusive OR of a value of an object point which is an object for processing and a value of a neighboring point in one direction with respect to the point and an exclusive OR of the value of the object point and a value of a neighboring point in the other direction with respect to the point, second obtaining means for obtaining an OR of both the exclusive ORs, and draw back means for drawing back the OR to a memory plane for drawing of the isomagnetic contour lines.

10. A method of measuring a magnetic field by measuring magnetic flux at points within the field, said method comprising the steps of;

measuring magnetic flux at plural points which correspond to two dimensional grids using plural SQUID flux meters to provide data signals representative of measured magnetic flux at the plural points, and interpolating to provide flux interpolation data representative of magnetic flux between the plural points, said step of interpolating including convoluting a sampling unit function data relating to one direction of the two dimensional grids and function data obtained by differentiating sampling unit function data in the other direction of the two dimensional grids with the data signals representative of measured magnetic flux.

11. A magnetic field measurement apparatus comprising;

plural SQUID flux meters for measuring magnetic flux at plural points which correspond to two dimensional grids and providing data signals representative of measured magnetic flux at the plural points, interpolation function obtaining means for obtaining interpolation function data representative of an interpolation function by convoluting sampling unit function data relating to one direction of said two dimensional grids and function data obtained by differentiating sampling unit function data in the other direction of said two dimensional grids with the data signals representative of the measured magnetic flux, and partial differential value calculating means for calculating partial differential value data representative of magnetic flux at an arbitrary point between the measured points based on said interpolation function data.

* * * * *